(12) United States Patent
Fuhrmann et al.

(10) Patent No.: US 12,123,923 B2
(45) Date of Patent: Oct. 22, 2024

(54) PREDICTING THE STATE OF HEALTH OF AN ELECTROCHEMICAL DEVICE BY MEASURING ITS DROP IN CAPACITY

(71) Applicant: ELECTRICITE DE FRANCE, Paris (FR)

(72) Inventors: Marion Fuhrmann, Paris (FR); Yo Kobayashi, Fontainebleau (FR)

(73) Assignee: ELECTRICITE DE FRANCE, Paris (FR)

( * ) Notice: Subject to any disclaimer, the term of this patent is extended or adjusted under 35 U.S.C. 154(b) by 139 days.

(21) Appl. No.: 17/965,155

(22) Filed: Oct. 13, 2022

(65) Prior Publication Data
US 2023/0117608 A1 Apr. 20, 2023

(30) Foreign Application Priority Data
Oct. 18, 2021 (FR) ........................................ 2111014

(51) Int. Cl.
*G01R 31/392* (2019.01)
*G01R 31/3835* (2019.01)
*G08B 21/18* (2006.01)

(52) U.S. Cl.
CPC ....... *G01R 31/392* (2019.01); *G01R 31/3835* (2019.01); *G08B 21/182* (2013.01)

(58) Field of Classification Search
None
See application file for complete search history.

(56) References Cited

U.S. PATENT DOCUMENTS

2012/0105069 A1 * 5/2012 Wang ................... G01R 31/392
324/427

FOREIGN PATENT DOCUMENTS

| EP | 3196663 A1 | 7/2017 |
| JP | 201653564 A | 4/2016 |
| JP | 2016197955 A | 11/2016 |
| JP | 2017129493 A | 7/2017 |

(Continued)

OTHER PUBLICATIONS

French Preliminary Search Report, with accompanying Written Opinion, issued on Jun. 7, 2022 in corresponding French Patent Application No. 2111014; 18 pages.

(Continued)

*Primary Examiner* — Jas A Sanghera
(74) *Attorney, Agent, or Firm* — Maier & Maier, PLLC (57) ABSTRACT

A method for predicting an acceleration of the degradation in capacity of an electrochemical device. The method includes obtaining point measurement data from a function linking a voltage across the terminals of the electrochemical device to a state of charge of the electrochemical device, and a measurement of the capacity of the electrochemical device, calculating the derivative of the function and identifying a peak in the variation of the derivative, due to an inflection in the variation of the function and characterizing a quantity representative of an anode capacity of the electrochemical device, estimating a width of the peak and comparing a combination of the peak width and the quantity representative of the anode capacity, to the measurement of the capacity of the electrochemical device, and if the combination is less than the capacity of the electrochemical device, predicting an acceleration of the degradation in capacity of the electrochemical device.

12 Claims, 8 Drawing Sheets

(56) References Cited

FOREIGN PATENT DOCUMENTS

WO 2013157132 A1 10/2013
WO 2020033343 A1 2/2020

OTHER PUBLICATIONS

Sijia Yang et al; Review on state-of-health of lithium-ion batteries: Characterizations, estimations and applications, Journal of Cleaner Production vol. 314; Jun. 20, 2021; 21 pages.
Minggao Ouyang et al; A dynamic capacity degradation model and its applications considering varying load for a large format Li-ion battery; Applied Energy vol. 165; Dec. 30, 2015; 12 pages.
Office Action issued on Jan. 22, 2024, in corresponding Japanese Application No. 2022-166355, 9 pages.

* cited by examiner

PREDICTING THE STATE OF HEALTH OF AN ELECTROCHEMICAL DEVICE BY MEASURING ITS DROP IN CAPACITY

FIELD

The invention lies within the field of energy storage and estimation of the life span of energy storage devices.

BACKGROUND

The invention relates to any type of electrochemical device and/or system for storing energy, such as:
Rechargeable battery,
Lithium-ion battery,
Solid state lithium-ion battery,
Sodium-ion battery,
Solid state sodium-ion battery, and/or others.

These devices may be intended for smartphones or laptops, or for electric vehicles (EV), or for systems (BES) for producing electrical energy from solar or wind energy, or others.

The invention therefore can be applied to all devices and systems in which there are electrochemical devices for storing electrical energy.

Figure 1:
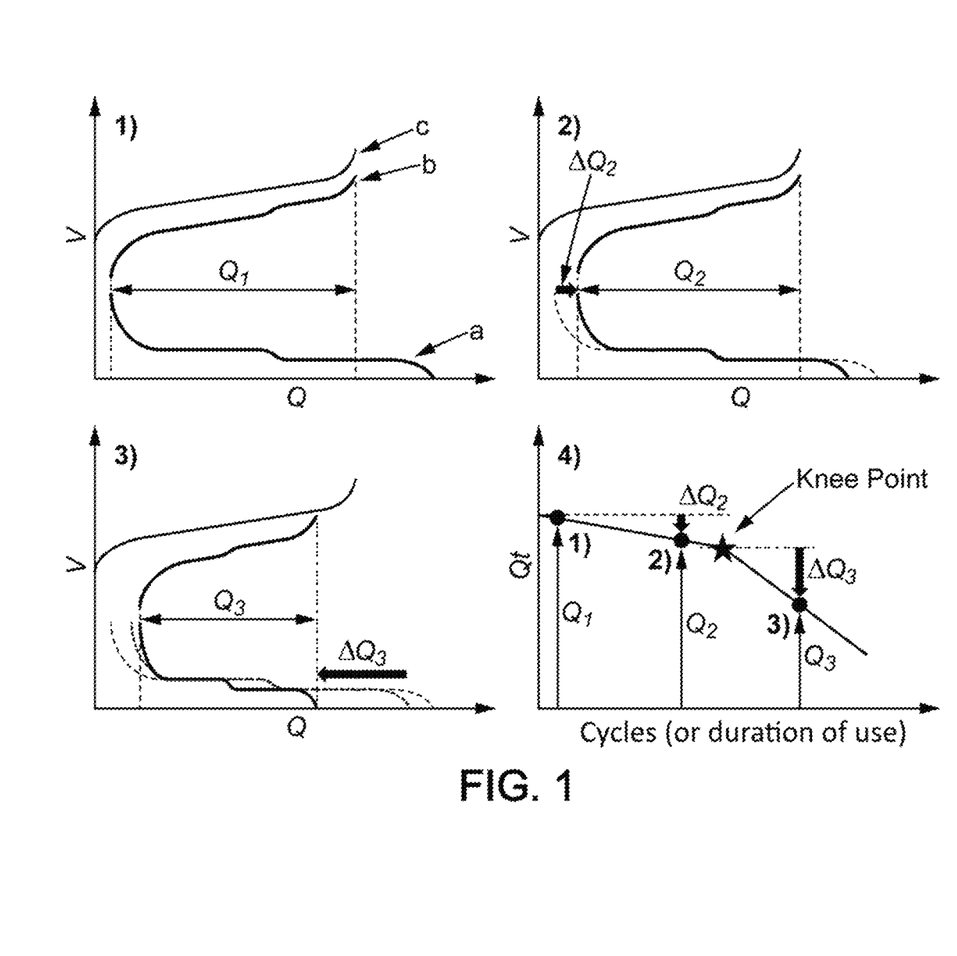
FIG. 1 illustrates the principle of the appearance of the Knee Point, derived for example from a drop in the anode capacity leading to a change in slope of the capacity of the device.

In such devices and/or systems, there is a need to predict a "rapid drop" in the capacity (hereinafter referred to as Knee Point) of electrochemical devices for storing energy, in particular using voltage measurement and voltage monitoring. With reference to FIG. 1 (part 4) at the bottom right, the knee point more specifically designates an acceleration of the drop in capacity: typically, it concerns, as illustrated in the example represented, a change in slope of the decrease in capacity as a function of the number of cycles of use (or more generally a duration of use). This capacity is denoted Qt in the figures and represents the total (i.e. maximum) capacity of the electrochemical device. It generally corresponds to the capacity of the cathode, which is a limiting factor when the device is new. It can be seen in particular in FIG. 1-4 that the absolute value of the slope increases at a given cycle, corresponding to the aforementioned Knee Point.

To date, this drop in capacity is observed in particular in lithium batteries, and is often linked to a metallic deposition of lithium (or "Li plating"), but such a drop in capacity can occur more generally in batteries which use intercalation materials for its two electrodes (anode and cathode).

Rechargeable Li-ion type electrochemical storage devices are based on reversible reactions at the positive (cathode) and negative (anode) electrode. The so-called "intercalation" reaction is central to the development of Li-ion batteries because it has high reversibility during charging/discharging operations.

During the "intercalation" reaction, the target ions (e.g. lithium or possibly sodium) move between the cathode and anode in the ion state, not in the metallic state, for the entire operation of the device. For example, in the case of a charging lithium-ion battery, Li ions are released from the cathode (deintercalation or deinsertion reaction) and are inserted at the anode (intercalation or insertion reaction). During discharge, the opposite reaction occurs at the cathode (intercalation) and at the anode (deintercalation). Such a reaction in the "ionic" state allows ensuring its reversibility and the proper operation of the rechargeable electrochemical device.

Such a reaction is reversible as long as no metallic deposition occurs. In other words, if the deposition reaction in the "metal" state occurs ("Li plating"), it induces an irreversible reaction. In addition to degrading the performance of the device and considerably reducing its capacity, "Li plating" facilitates the formation of lithium dendrites which can create internal short circuits and therefore safety issues. This is why it is important to reduce any metal deposition as much as possible during the operation of rechargeable electrochemical storage devices.

Localized deposition of metallic lithium can occur primarily on graphite anodes, due to the proximity of the potential of graphite and of metallic lithium.

The intercalation capacity of the electrode is defined based on the number of crystallographic sites accessible to the ionic species, or based on the ratio between the ionic species and the host metal in the case of a metal alloy. The maximum quantity of ions accepted by each electrode therefore corresponds to its theoretical capacity. When an excess of ions migrates towards the anode (i.e. more ions than available sites), these ions are no longer inserted into the structure but are deposited on the surface of the graphite in the form of metal. Therefore, rechargeable electrochemical storage devices are often designed with excess capacity on the anode side.

When metal deposition occurs during operation of the device, significant irreversible reactions occur and lead to a rapid decrease in capacity. A point of inflection is then observed on the aging curve of the device, corresponding to the aforementioned Knee Point, represented by a star in FIG. 4. The region in which there is a risk of metal plating (with lithium for example) is illustrated in gray in FIG. 4 (part 4 bottom right). More generally, a Knee Point may also be observed with other degradation mechanisms, such as loss of cathode capacity, loss of liquid electrolyte, or others (for example in devices other than lithium-ion batteries). However, the Knee Point induced by the deposition of metallic lithium also leads to a hazardous state of the device (risk of fire in particular). Therefore, the Knee Point due to metal plating is the most important event to avoid during operation.

An example of the appearance of a Knee Point following the deposition of metallic lithium is explained below.

The voltage profile V of a rechargeable electrochemical storage device, as a function of its state of charge (denoted Q in the figures), is determined by the potential difference between the cathode and the anode. It constitutes a good indicator which allows predicting the Knee Point linked to a deposition of lithium metal. A typical example of an analysis is shown in FIG. 1-1. The curve denoted "a" represents the anode voltage profile and the curve "c" represents the cathode voltage profile, during charging. Curve "b" represents the voltage of the device, which corresponds to curve "c"-"a". The reversible capacity of the device then corresponds to the overlapping region, denoted Q1. In this example, it is assumed that there is no loss of capacity on the cathode side.

After degradation/aging, the reversible capacity of the device is reduced to Q2 in FIG. 1-2. In this case, the anode voltage is shifted to the right (shift of the curve) by ΔQ2 and reduced (with a narrowing of the curve). Here the reversible capacity of the anode has decreased but it is still greater than the capacity of the device (limited by the capacity of the cathode), so there is no effect (yet) on the total capacity of the device.

After further aging, the reversible capacity is reduced to Q3 as shown in FIG. 1-3. In this case, the reversible capacity of the anode (which becomes the limiting electrode and now determines the total capacity of the device) becomes less than the capacity of the cathode. There is therefore an excess of lithium ions in comparison to the insertion sites available at the anode, and the anode potential reaches 0 V, inducing a significant risk of metallic deposition.

FIG. 1-4 shows a typical trend in the capacity Qt as a function of the charge/discharge cycles (or operating time) of an electrochemical device of the aforementioned type. Between Q1 and Q2, the slope of the loss of capacity is constant because it is governed by the value taken by ΔQ2. Then, the slope of the loss of capacity changes to form a point of inflection: this is the Knee Point. Therefore in this case, the loss of capacity is now governed by the loss of capacity of the anode. This is a typical example to illustrate the appearance of the Knee Point due to degradation of the anode.

As the anode is usually designed so that its capacity is greater than that of the cathode in order to avoid metal plating, in practice it is difficult, if not impossible, to measure the capacity of the anode directly based on the variation in voltage of the device.

Figure 2:
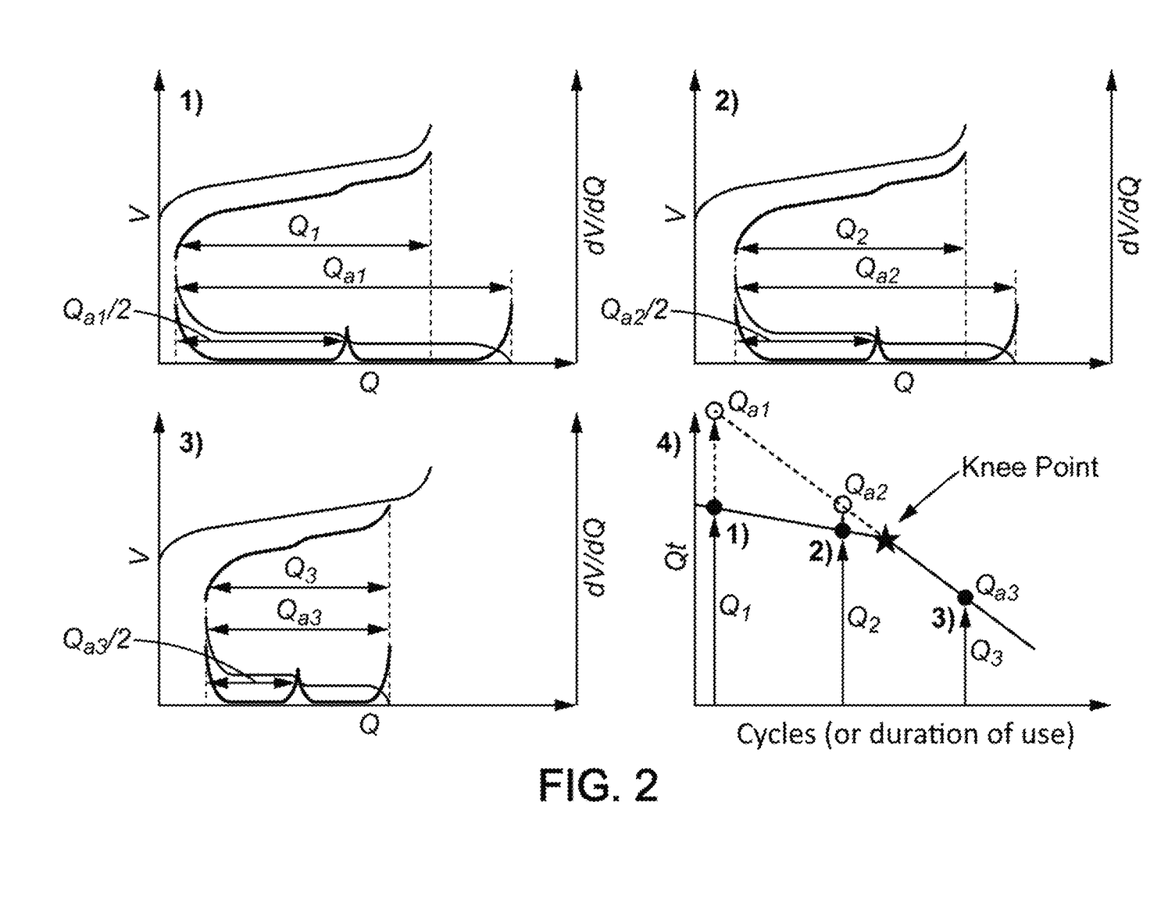
FIG. 2 illustrates the prediction of the Knee Point by analysis of the derivative dV/dQ.

To estimate the anode capacity, an analysis of the derivative (differential analysis) of the voltage versus capacity (dV/dQ) is generally used. With reference to FIG. 2, this is the variation dV/dQ (on the right of each graph 1 to 3) drawn with bold black lines. For example, the anode material (typically graphite) exhibits a voltage profile consisting of plateaus during the intercalation and deintercalation of lithium ions. The most distinct plateau is observed at half the anode capacity, Qa/2, as shown in FIG. 2. Charging is assumed to start with the anode completely delithiated (when almost no lithium ions are present in the structure of the graphite). Therefore, the capacity measured between the start of charging and the highest peak of dV/dQ is Qa/2. The reversible capacity of the anode Qa can then be estimated from the position of this peak, by Qa=2×Qa/2, as shown in FIG. 2-1.

After degradation as in FIG. 2-2, the loss of anode capacity can be estimated using the dV/dQ analysis. It is then possible to predict the appearance of a Knee Point by using the dV/dQ analysis and the estimation of the capacity of the anode after degradation. By plotting the reversible capacity of the anode as a function of the charge/discharge cycles or days of use, it is possible to predict the Knee Point by extrapolating the trend in the Qa capacity and finding its point of intersection with the capacity of the device. In other words, the Knee Point corresponds to the point at which the total capacity of the device Qt becomes equal to the capacity of the anode Qa (the limiting electrode no longer being the cathode but becoming the anode).

This estimation of the appearance of a Knee Point is based on the capacity between two peaks, to obtain the value of the anode at half-capacity Qa/2. However, experience shows that in practice it may happen that a Knee Point appears before it is predicted by this technique. In other words, the Knee Point may appear when the reversible capacity of the anode Qa is still greater than the capacity Qt of the device. Consequently, additional considerations must be implemented in order to predict the Knee Point more precisely, for practical use.

SUMMARY

The present invention improves the situation.

To this end, it proposes a method for predicting an acceleration of the degradation in capacity of an electrochemical device (detected by observing a change in slope or a point of inflection of the aforementioned Knee Point type, in the evolution of the capacity), the method comprising:

Obtaining point measurement data from a function linking a voltage (V) across the terminals of the electrochemical device to a state of charge (Q) of the electrochemical device, and a measurement of the (total) capacity of the electrochemical device, Calculating the derivative of said function and identifying a peak in the variation of said derivative, due to an inflection in the variation of said function and characterizing a quantity representative of an anode capacity of the electrochemical device (Qa/2), Estimating a width of the peak (σ), and comparing a combination of the peak width and the quantity representative of the anode capacity, with the measurement of the capacity (Qt) of the electrochemical device, and If said combination is less than the capacity of the electrochemical device, predicting an acceleration of the degradation in capacity of the electrochemical device.

Thus, the invention proposes predicting the aforementioned Knee Point based on the position and the degree of broadening of the peaks of the curve of a derivative function such as dV/dQ, this broadening being representative of the degree of non-uniformity within the electrochemical device. By analyzing this degree of non-uniformity, it is possible to predict the appearance of the Knee Point (and to do so for various applications).

In one embodiment, the function for which the derivative is calculated (dV/dQ) is the variation in voltage (V) as a function of the state of charge (Q) of the electrochemical device, and the quantity representative of the anode capacity is half the capacity of the anode of the electrochemical device (Qa/2), given by the abscissa of the aforementioned peak.

Of course, alternatively, it is also possible to find a point of singularity given by the derivative dQ/dV of the reciprocal function Q(V) (instead of the above choice of function V(Q)).

In one embodiment, the width of the peak (σ) is estimated by adjusting (or "fitting") a Gaussian to the peak and thus measuring the width of this Gaussian.

The width σ of the Gaussian can typically be given by the base of the Gaussian (intersection with the x axis) or estimated from its width at mid-height for example, or in another manner.

Of course, there are variants for the Gaussian fit in particular (Bézier curve fitting, or others).

In one embodiment, the aforementioned combination is given by $2*(Qa/2)-N\cdot\sigma-\epsilon$, where:

(Qa/2) is a value corresponding to half the capacity of the anode of the electrochemical device, N is a natural number greater than or equal to 1, σ corresponds to the estimate of the width of the peak, and ε is a chosen safety threshold (for example equal to a percentage of the total capacity Qt of the electrochemical device, for example 10% of Qt).

The integer N may be chosen for example based on the type of electrochemical device in play (for example N=3).

In one embodiment, if the aforementioned combination is less than the capacity of the electrochemical device, an accelerated physical degradation of the electrochemical device, characterized by formation of a metallic deposit at the anode of the electrochemical device, is further predicted.

For example, the electrochemical device may comprise at least one lithium battery and the deposit forming at the anode is a deposit of metallic lithium.

In the case of a sodium-ion battery, a sodium deposit may also form at the anode.

This acceleration of the degradation in capacity may more generally occur in anode devices comprising graphite (pure or alloy).

Such a situation is a sign of the imminent death of the electrochemical device.

Such an end can be reached in particular when the total capacity Qt becomes equal to $2*(Qa/2)-N\cdot\sigma$. It will thus be understood that the above term $\epsilon$ serves to warn a user sufficiently in advance.

Moreover, in one embodiment, the method further comprises the generation of a warning signal if the aforementioned combination is less than the capacity of the electrochemical device, and in particular if the margin represented by the safety threshold $\epsilon$ begins to be reached.

In particular, the warning signal (or a second warning signal) may indicate an imminent end of life of the electrochemical device (in particular if the margin $\epsilon$ has been exceeded).

In one embodiment, the aforementioned prediction of an acceleration of the degradation in capacity of the electrochemical device can be corroborated by an increase, to beyond a threshold (which may be predefined or relative), of a measured volume of the electrochemical device (as presented below in some embodiments).

The invention also relates to a device for predicting an acceleration of the degradation in capacity of an electrochemical device, comprising at least one processing circuit connected to the electrochemical device in order to implement the method presented above.

Figure 8:
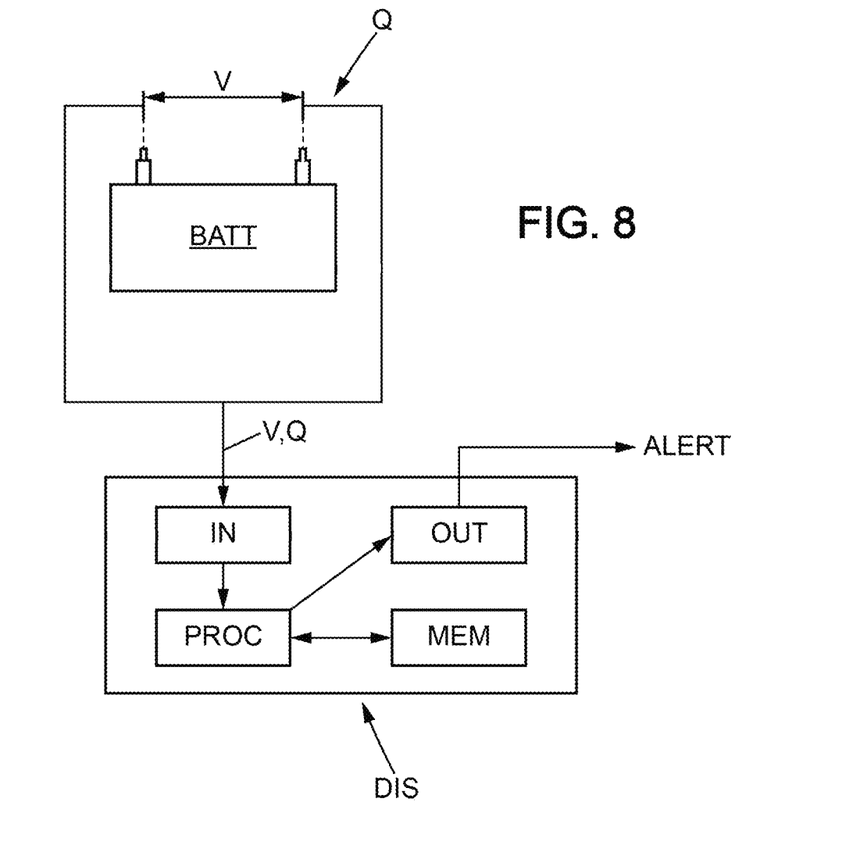
FIG. 8 schematically presents an example of a prediction device as described above.

Referring to FIG. 8, the processing circuit of the prediction device DIS may include:
- an input interface IN of signals from the electrochemical device BATT, during its charge or its discharge, these signals then being the voltage V (in volts) applied across the terminals of the electrochemical device BATT and the charge/discharge Q (in ampere hours),
- a memory MEM capable of at least temporarily storing voltage and charge/discharge values, as well as instruction data from a computer program for implementing the above method,
- a processor PROC capable of cooperating with the memory MEM and in particular of reading the instructions stored in the memory in order to execute in particular the calculation and comparison steps of the method defined above, and
- an output interface OUT cooperating with the processor PROC to deliver a possible warning signal ALERT intended to be played by a human-machine interface (displayed on a screen or played as an audio signal).

The processing circuit may also include a circuit breaker (not represented in FIG. 8) for isolating the electrochemical device and stopping its operation (charging or discharging) when the total capacity Qt becomes equal to $2*(Qa/2)-N\cdot\sigma$ (therefore when the margin $\epsilon$ is exceeded for example).

The invention also relates to the computer program comprising instructions for implementing the above method, when these instructions are executed by a processor of a processing circuit (for example of the type illustrated in FIG. 8).

According to another aspect, a non-transitory, computer-readable storage medium is provided on which such a program is stored.

BRIEF DESCRIPTION OF DRAWINGS

Other features, details, and advantages will become apparent upon reading the detailed description below, and upon analyzing the appended drawings, in which.

DETAILED DESCRIPTION

Figure 3:
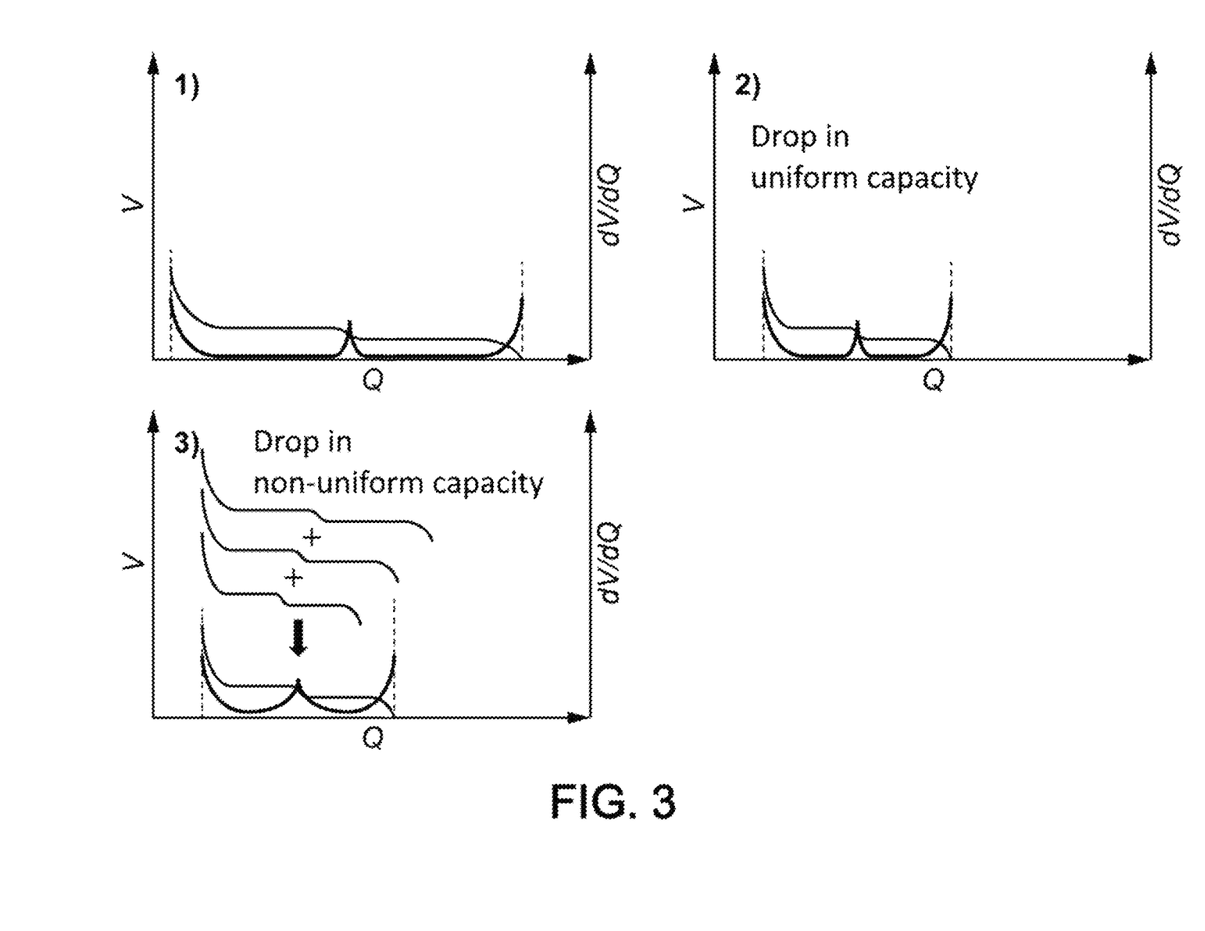
FIG. 3 illustrates a non-uniform loss of capacity leading to an early Knee Point.

We first refer to FIG. 3 to explain the degree of device non-uniformity, FIG. 3 showing a focus on the anode voltage and the dV/dQ curves before and after the drop in capacity.

In the case of a uniform loss of capacity, the anode degrades uniformly over its entire surface. In this case, the voltage profile of the electrodes is identical at all points of the device. Therefore, there is no broadening of the dV/dQ curve after aging of the device, as shown in FIG. 3-2.

Figure 7:
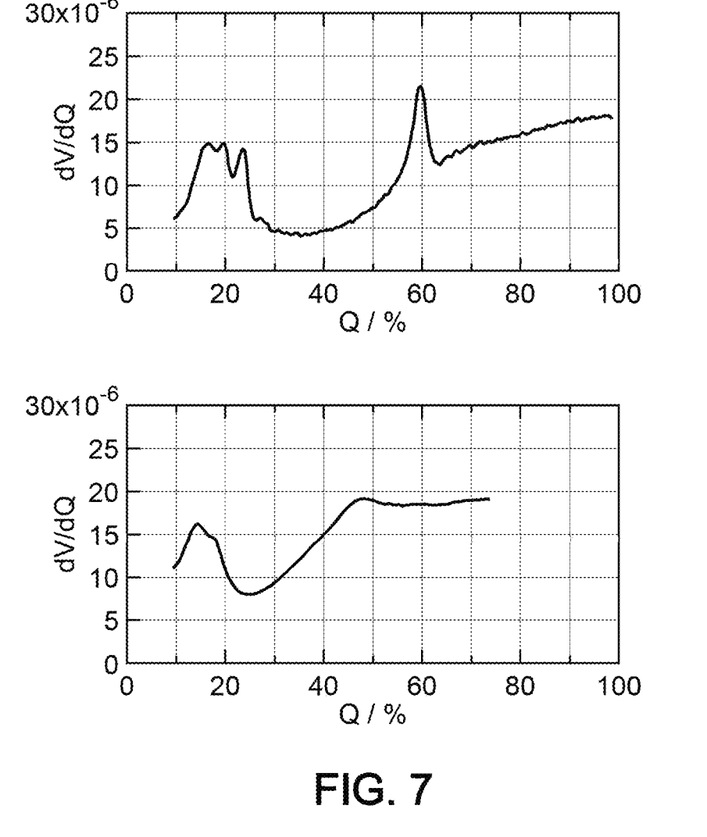
FIG. 7 comparatively shows the dV/dQ peak for a state close to a reference state (top of the figure), with a broadening of this peak (around 50%) for a more degraded state of the same electrochemical device (bottom), thus yielding the width $\sigma$ of the distribution.

On the other hand, if the loss of capacity of the anode is non-uniform (more or less significant degradation depending on the regions), the voltage of the electrode is different from one position to another. Some regions still retain a high capacity while other regions lose more capacity. This situation is illustrated in FIG. 3-3. There is a slope change in both cases but if the degradation is non-uniform, it is preferable to take into account the variability of the anode voltage in order to predict the arrival of a Knee Point with good reliability. This type of non-uniform degradation occurs especially for large-capacity devices due to large reaction surfaces and/or due to the strong variation in thermal conditions within the electrochemical device, but it can also occur for devices that are small in size. The corresponding dV/dQ curves show a broadening of the peaks (FIG. 7) due to the significant variation in voltage of the anode across its entire surface.

Figure 4:
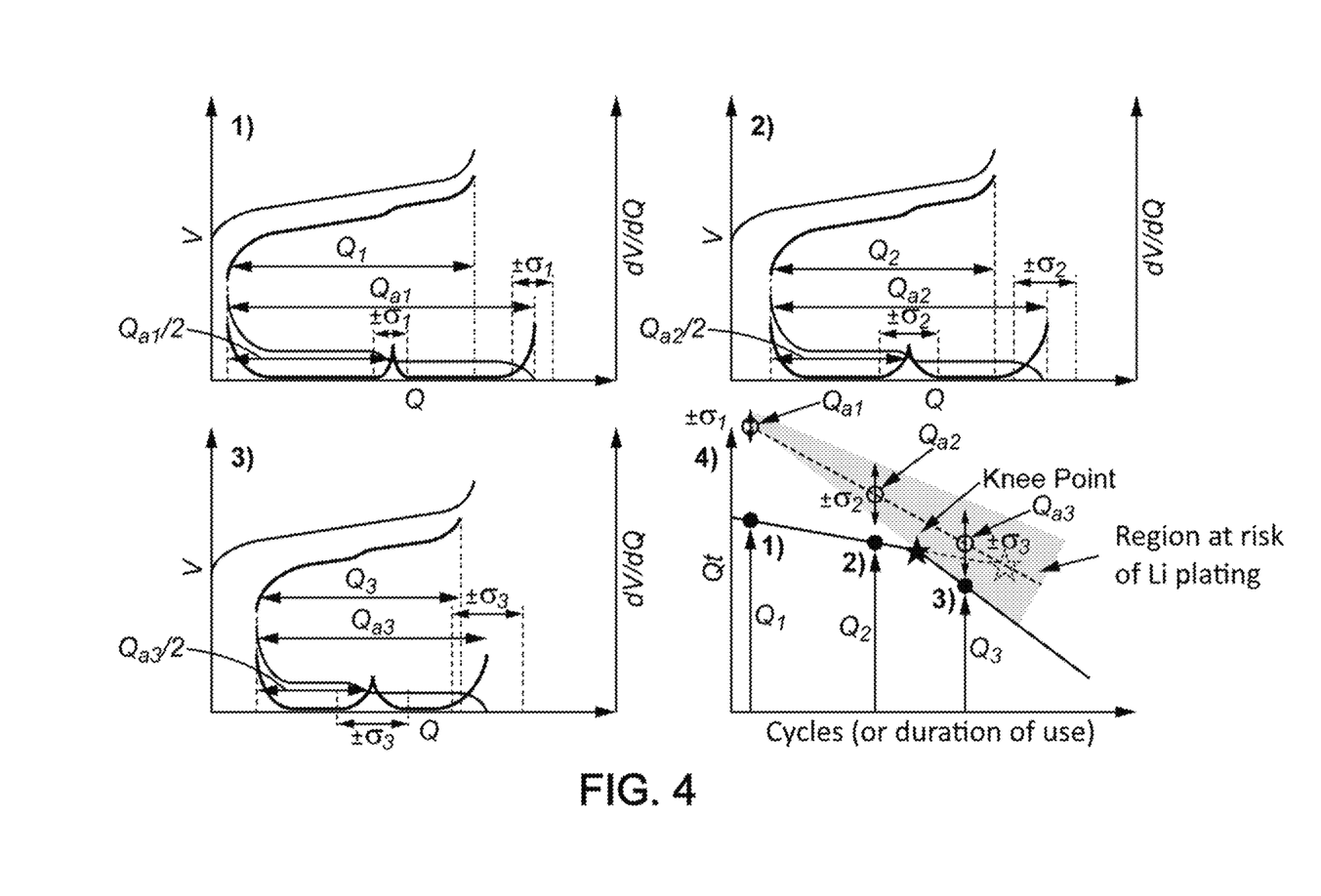
FIG. 4 illustrates prediction of the Knee Point, by analysis of the derivative dV/dQ and using a Gaussian distribution $\sigma$ ($\sigma1$, $\sigma2$, $\sigma3$), this distribution characterizing (and increasing with) the degradation of the electrochemical device.

The invention then proposes predicting the appearance of the Knee Point by using the degree of non-uniformity present within the device, as shown in FIG. 4. The degree of non-uniformity may be estimated by adjusting the peak corresponding to half the capacity of the anode, Qa/2. The peak can be extrapolated by a Gaussian curve.

FIG. 4-4 shows an implementation of this embodiment to predict the risk of a Knee Point linked for example to deposition of metal at the anode. In the existing state of the art, the Knee Point is estimated simply by the value of Qa/2 (position of the corresponding peak on the dV/dQ curve) represented by the gray dotted star in FIG. 4-4. In the invention, the risk of metal deposition can be detected using the distribution of the Gaussian peak (position and width of the corresponding peak on the dV/dQ curve), represented by the gray cone-shaped region in FIG. 4-4. The risk of a Knee Point estimated in this manner corresponds to the point of intersection of the extrapolation of line Q1-Q2 with the gray region, indicated by the black star in FIG. 4-4. It is thus understood that prediction of the Knee Point within the meaning of the invention (indicated by the black star) may be earlier than that of the prior art (indicated by the gray star).

Figure 5:
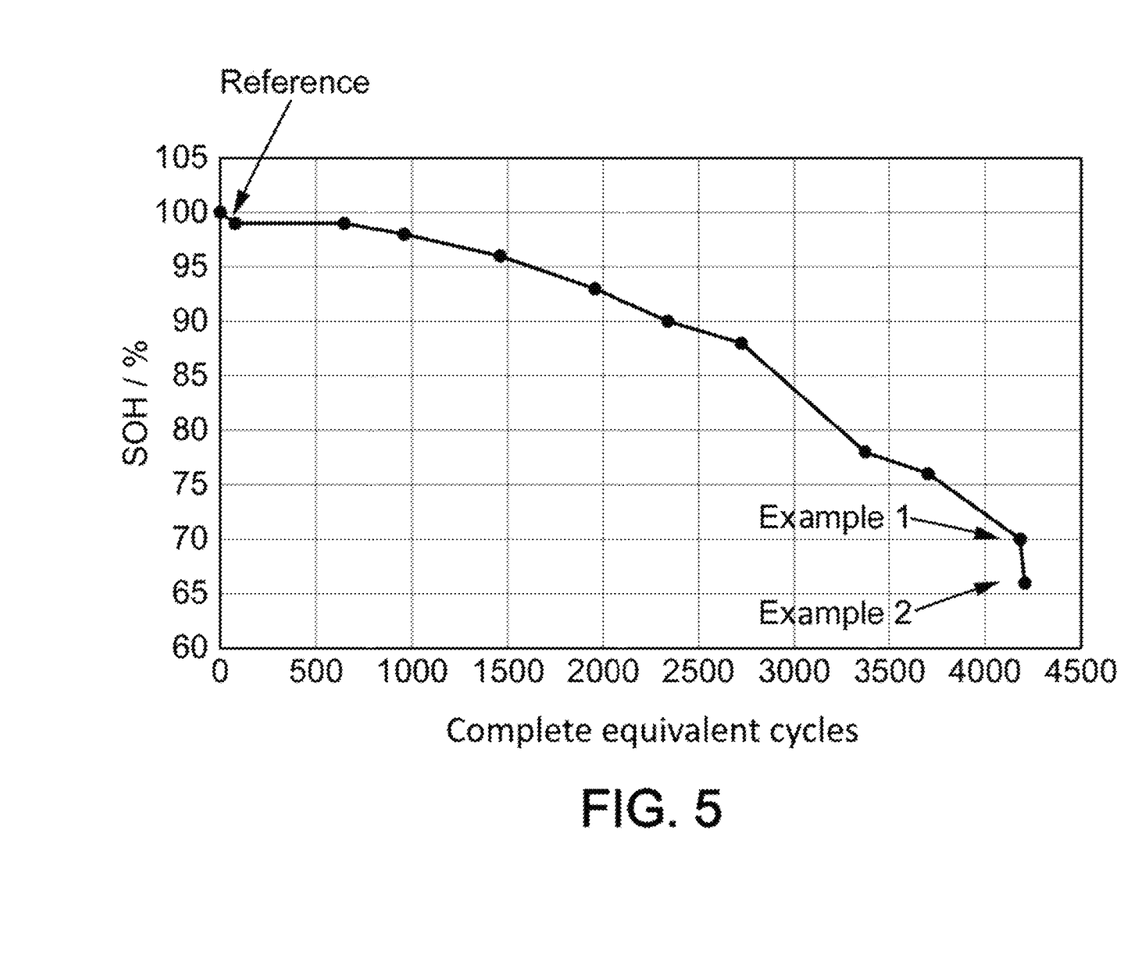
FIG. 5 illustrates the degradation in the state of health (SoH) of the device, by the accelerated loss of capacity, as a function of the number of cycles, here with two states of degradation ("example 1" corresponding to the point before the knee point and "example 2" corresponding to the point after the knee point) appearing after 4000 cycles, after starting from a reference state in which the SoH is fixed at 100%.

In a concrete example, a set of class 200 Wh lithium-ion batteries was used as a sample. The cathode consisted of a lamellar oxide, and the anode of graphite. The cycling tests were carried out at 10° C. and 1C (C being the current applied according to the nominal capacity of the battery). Battery capacity was measured at 25° C., C/2 and C/25 before and after cycling. The capacity curve at C/2 as a function of the number of complete equivalent cycles is shown in FIG. 5. The dV/dQ curves (at 25° C. and C/25) were also calculated and fitted using Gaussian curves before (reference example) and after cycling, more precisely just before the Knee Point (first working example), and just after the Knee Point (second working example). The anode capacity margin (excess capacity at the anode compared to the capacity of the cathode) before a risk of metallic lithium deposition was estimated using the distribution σ of the Gaussian fit.

A first battery was removed before cycling and a second one after cycling, in a glove box under argon.

In the reference example, the initial battery capacity before cycling was defined with a state of health SoH of 100%. The anode capacity estimated from the Qa/2 value was 120.6% compared to the battery capacity measured at C/25. The distribution of the anode capacity estimated from the Gaussian fit was 4.8%. As a result, the anode capacity margin relative to the risk of lithium deposition was estimated at 15.8%. Consequently, the anode capacity margin is sufficient, and the risk of Li metal deposition and therefore of accelerated degradation of the device is very limited.

Moreover, in the case of the reference sample, no metallic deposit was identified on the surface of the anode upon removal of the battery.

In the first working example, after 4182 complete equivalent cycles, the measured SoH at C/2 was 69.6% and the measured SoH at C/25 was 79.4%. The anode capacity estimated from the Qa/2 value was 99.0% compared to the battery capacity at C/25 before cycling. The distribution of the anode capacity estimated from the Gaussian fit was 19.2%. As a result, the capacity margin relative to the risk of lithium metal deposition was estimated at 0.4%.

From this small margin, it is already possible to predict that acceleration of the degradation and observation of a Knee Point are probably about to occur due to the high risk of metallic lithium deposition. The Knee Point can therefore be predicted even before the actual acceleration of the loss of battery capacity.

This degradation of the battery due to the phenomenon of metallic lithium deposition is generally accompanied by a change in volume of the battery. Here, typically, the average thickness of the battery was 122.9% compared to that of the reference battery (volume increase of about 23%).

In the second working example, after 4206 complete equivalent cycles, the measured SoH at C/2 was 65.9% and the measured SoH at C/25 was 78.0%. The anode capacity estimated from the Qa/2 value was 92.8% compared to the battery capacity measured at C/25 before cycling. The capacity distribution estimated from the Gaussian fit was 16.6%. As a result, the capacity margin relative to the risk of lithium deposition was estimated at −1.8%, showing that there is a high risk that Li metal deposition has already occurred.

The average thickness of the battery was 134.6% compared to that of the reference battery (volume increase of approximately 35%).

During disassembly of this cell, a deposition in the form of powder was observed on the surface of the anode. The deposited powder was identified as lithium metal by reaction with ethanol, confirming that the Li plating mechanism has already taken place.

These results show that it is possible to predict the deposition of metallic lithium and therefore a Knee Point before its actual appearance, typically here in the first working example.

Figure 6:
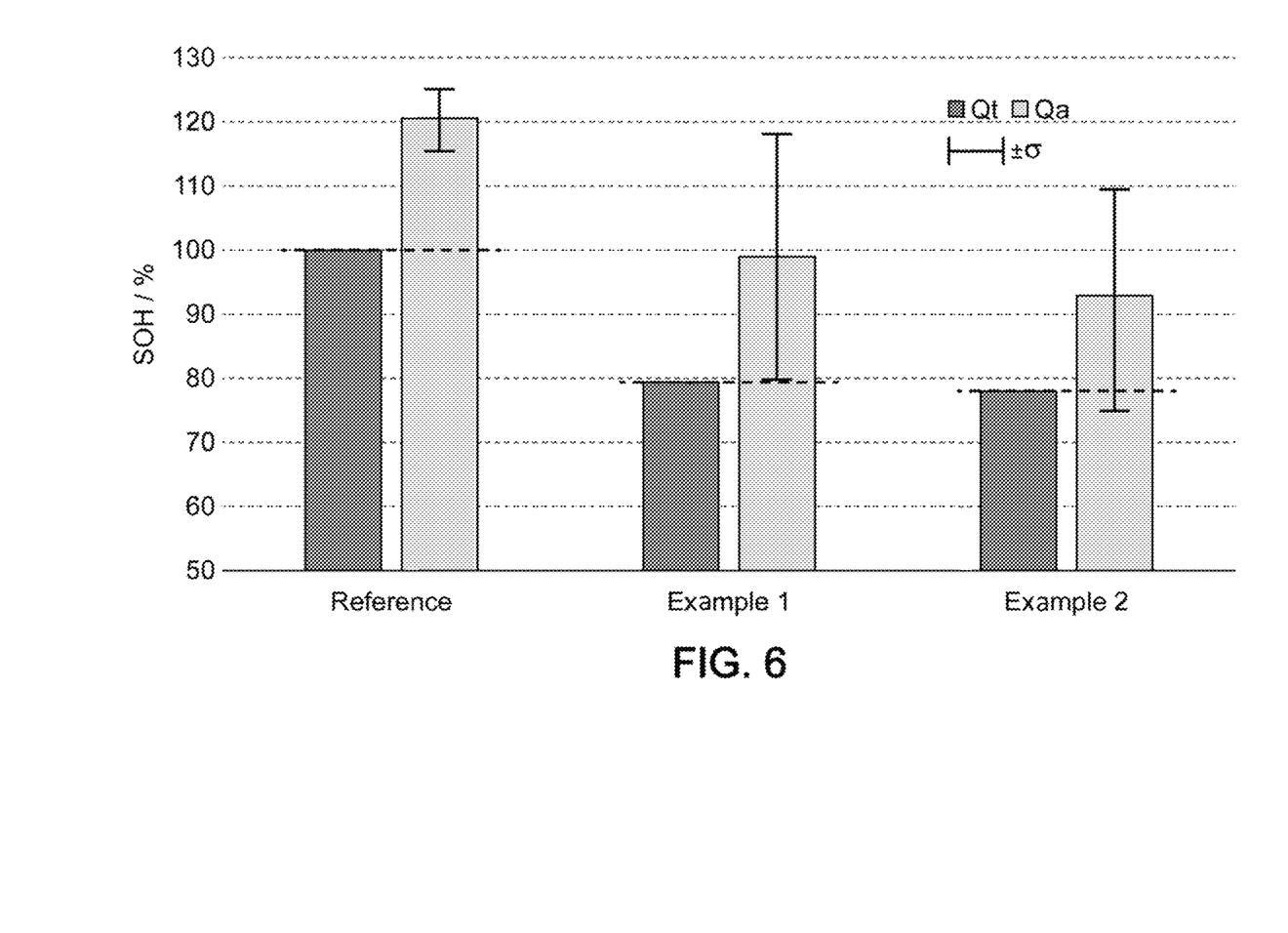
FIG. 6 illustrates the total capacity of the electrochemical device (Qt) and the capacity of the anode (Qa) before and after aging, and the vertical bars correspond to the distribution $\sigma$ of the capacity estimated by Gaussian fitting of the dV/dQ curves at point Qa/2.

By means of the invention, the variation in anode capacity is taken into account by analyzing the distribution of the dV/dQ curve at point Qa/2. The width of the corresponding peak (for example at mid-height) is represented in FIG. 6 by error bars characterizing the variability of the anode capacity within the device for the reference example (at SoH=100%) and examples 1 and 2. In the case of example 1, the lower bound of the error bar is close to the capacity of the battery. This indicates a high risk of future lithium metal deposition. In the case of the second working example, the lower bound of the error bar becomes less than the battery capacity and shows that the risk of having triggered the lithium metal deposition mechanism (and having exceeded the Knee Point) is very high. The lithium deposition observed upon opening the cell confirms that this mechanism has indeed taken place. Consequently, the analysis within the meaning of the invention is suitable for identifying lithium deposition in a real case but above all for predicting the degree of risk of lithium deposition (and therefore of acceleration of the loss of capacity) by analyzing the distribution of the capacity of the anode at a given state of health, in accordance with example 1 described above.

Of course, the invention is not limited to the embodiments presented above by way of example.

For example, it is not limited to observing the variation in dV/dQ. The heat flux produced by the battery during charging and discharging (P), may also be used as an indicator of the degree of non-uniformity within the device. In the case of analyzing P, a similar method can be applied, based on dP/dQ instead of dV/dQ. It is also possible to apply an inverse differential analysis, such as dQ/dV and dQ/dP. One can also use the combination of voltage and heat flux, dV/dP and also dP/dV, for a similar analysis.

The invention may also be implemented by applying the procedure proposed above to the change in the thickness of the battery. For example, one can obtain an appropriate indicator by combining the evolution of the anode capacity distribution and the evolution of the battery thickness. By including thickness tracking, the accuracy of the Knee Point risk prediction can then be improved.

Furthermore, the experimental example above uses a lithium-ion battery. However, the proposed invention is not limited to this type of battery. For example, in the case of a sodium-ion battery, a similar graphite anode is used. The same procedure may therefore also be applied to a sodium-ion battery.

The proposed invention may also be applied to batteries with an alloy-type anode such as silicon and/or tin. In the case of an alloy-type anode, there is no distinct dV/dQ peak when charging or discharging the battery, so it is preferable to use the dQ/dV curve to estimate the battery capacity distribution.

The results obtained show that the analysis within the meaning of the invention is effective in estimating the risk of a Knee Point, and from this the lifespan of the electrochemical device.

Indeed, this prediction of the Knee Point within the meaning of the invention can be applied to evaluating the useful life of electrochemical devices. In the existing state of the art, extrapolation of the actual capacity curve (based on the number of cycles or days since placed in service) by a linear function or another mathematical function is often used to estimate the remaining lifespan of a device. This extrapolation method does not allow estimating an acceleration in the loss of capacity based on the Knee Point. By estimating the degree of risk of the appearance of a Knee Point, it is then possible to estimate the actual remaining life of the electrochemical devices.

Thus, for example, by means of the invention, it is possible to provide a more precise estimate of the state of health and a prediction of the lifespan of a battery for users of electric vehicles. The invention can also allow more accurately determining the resale value of an electric vehicle's battery with a view to its next life within a stationary storage system for example. It also allows the operator to be alerted (in particular before the risk of an accident) when maintenance or replacement is necessary.

The invention claimed is:

1. A method for predicting an acceleration of the degradation in capacity of an electrochemical device, the method comprising:
    obtaining point measurement data from a function linking a voltage between terminals of the electrochemical device to a state of charge of the electrochemical device, and obtaining a measurement of the capacity of the electrochemical device,
    calculating the derivative of said function and identifying a peak in a variation of said derivative, due to an inflection in the variation of said function, said inflection characterizing a quantity representative of an anode capacity of the electrochemical device,
    estimating a width of the peak and comparing a combination of the peak width and the quantity representative of the anode capacity, with the measurement of the capacity of the electrochemical device, and
    if said combination is less than the capacity of the electrochemical device, predicting an acceleration of the degradation in capacity of the electrochemical device.

2. The method according to claim 1, wherein the function for which the derivative is calculated is the variation in voltage as a function of the state of charge of the electrochemical device, and the quantity representative of the anode capacity is half the capacity of the anode of the electrochemical device, given by the abscissa of said peak.

3. The method according to claim 1, wherein the width of the peak is estimated by fitting a Gaussian to said peak and measuring the width of said Gaussian.

4. The method according to claim 1, wherein said combination is given by:
    where:
        (Qa/2) is a value corresponding to half the capacity of the anode of the electrochemical device,
        N is a natural number greater than or equal to 1,
        σ corresponds to the estimate of the width of the peak,
        * denotes multiplied by, and
        ε is a chosen safety threshold.

5. The method according to claim 1, wherein, if said combination is less than the capacity of the electrochemical device, a degradation of the electrochemical device, characterized by formation of a metallic deposit at the anode of the electrochemical device, is further predicted.

6. The method according to claim 5, wherein the electrochemical device comprises at least one lithium battery and the deposit forming at the anode is a deposit of metallic lithium.

7. The method according to claim 5, wherein the anode comprises graphite.

8. The method according to claim 1, further comprising the generation of a warning signal if said combination is less than the capacity of the electrochemical device.

9. The method according to claim 8, wherein the warning signal indicates an imminent end of life of the electrochemical device.

10. The method according to claim 1, wherein said prediction of an acceleration of the degradation in capacity of the electrochemical device is corroborated by an increase of a measured volume of the electrochemical device, to beyond a threshold.

11. A device for predicting an acceleration of the degradation in capacity of an electrochemical device, comprising at least one processing circuit connected to the electrochemical device in order to implement the method according claim 1.

12. A computer medium storage storing instructions of a computer program causing the implementation of the method according to claim 1, when computer program is executed by a processor of a processing circuit.

* * * * *